(12) United States Patent
Dutta et al.

(10) Patent No.: US 8,643,187 B1
(45) Date of Patent: Feb. 4, 2014

(54) ON-CHIP INTERCONNECTS VIAS AND METHOD OF FABRICATION

(75) Inventors: Achyut Kumar Dutta, Sunnyvale, CA (US); Robert Olah, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 14 days.

(21) Appl. No.: 13/151,242

(22) Filed: Jun. 1, 2011

(51) Int. Cl.
*H01L 29/40* (2006.01)
*H01L 21/4763* (2006.01)

(52) U.S. Cl.
USPC .......................................... 257/773; 438/619

(58) Field of Classification Search
None
See application file for complete search history.

(56) References Cited

U.S. PATENT DOCUMENTS

| | | | |
|---|---|---|---|
| 7,595,555 B2 * | 9/2009 | Clarke et al. | 257/758 |
| 7,608,909 B2 * | 10/2009 | Chinthakindi et al. | 257/522 |
| 8,420,524 B2 * | 4/2013 | Yu et al. | 438/619 |
| 2002/0066591 A1 * | 6/2002 | Li et al. | 174/255 |
| 2002/0158337 A1 * | 10/2002 | Babich et al. | 257/758 |
| 2006/0057835 A1 * | 3/2006 | Anderson et al. | 438/619 |
| 2008/0023804 A1 * | 1/2008 | Dutta | 257/664 |
| 2010/0270677 A1 * | 10/2010 | Usami | 257/773 |
| 2010/0327068 A1 * | 12/2010 | Chen et al. | 235/492 |

* cited by examiner

*Primary Examiner* — Matthew Landau
*Assistant Examiner* — Priya Rampersaud

(57) ABSTRACT

An interconnection system is provided with reduced capacitance between a signal via and the surrounding dielectric material. By using a non-homogenous dielectric, the effective dielectric constant of the system is reduced. The signal vias are surrounded with some combination of open trenches and/or grounded vias to decrease the effective dielectric constant of the surrounding system, providing shielding from the interference of nearby signal lines and vias. The fabrication techniques provided are advantageous because they can be preformed using today's standard IC fabrication techniques.

19 Claims, 9 Drawing Sheets

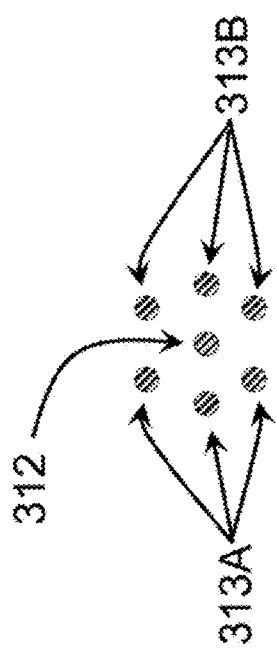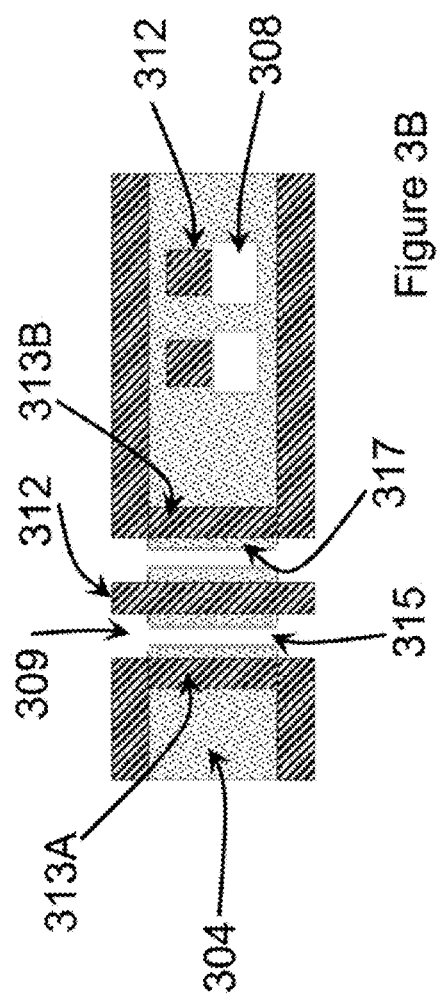

ON-CHIP INTERCONNECTS VIAS AND METHOD OF FABRICATION

STATEMENT REGARDING FEDERALLY SPONSERED RESEARCH OR DEVELOPMENT

This invention was made with Government support under contract no. W31P4Q-08-C-0370 awarded by US Army Aviation and Missile Command. The Government has certain rights in the invention.

CROSS-REFERENCE TO RELATED APPLICATIONS

Not applicable

FIELD OF INVENTION

This invention relates to high speed on-chip interconnection system using shielded vias to reduce the capacitance between vias and the surrounding dielectric material used in on-chip electronic interconnects. This invention is also related to high speed electronic interconnects reducing power consumption, and methods of fabricating on-chip interconnect.

BACKGROUND OF THE INVENTION

Integrated circuit chips today have up to 774 million transistors and have a die size of 296 mm². With such complexity of designs, and the number of transistors that need to be "placed and routed" (in industry terms), the wires that connect the transistors are becoming increasingly complex and small. As wires have gotten smaller, they have or are about to reach the limits of physics.

On-chip interconnects have been a rising area of concern to the IC chip industry as interconnects have increased in resistance and capacitance, leading to timing issues and higher power consumption by the interconnects. Nearly half the power consumed by an average computer is spent on the interconnects! This is because as the transistors have gotten smaller, the wires connecting them have also gotten smaller, but without help, the tiny signals from each transistor are not strong enough to make it across even the tiniest wires. Another structure, called a repeater or a buffer, is needed to strengthen the signal.

When playing with large components like connecting wires and light bulbs to batteries, the wire was thought to be an equipotential region throughout the wire and also the voltage and current change was instantaneous. Wires are considered ideal when the circuits are designed for functionality like converting mp3 data bits into music. In the implementation of functions via actual IC circuits, however, the reality is that dimensions of current IC wires (interconnects) are so small that parasitic capacitance and resistance, properties of their geometry, material properties and the surrounding material, become so complex on the scale that they cannot be ignored and become significant design challenges.

When the cross sectional area of wires became small enough that their resistance increased immensely and yet their lengths did not scale as much, then the resistance and capacitance due to the wire could no longer be ignored. They were termed parasitic resistance and capacitance and contributed to the delay of the signal propagation along the wires.

Ultimately, since interconnects on VLSI chips are the material media where currents and charge are moving in, then in general it also follows electromagnetic laws. However transmission line effects come into play when wavelengths of the signal are comparable to the dimensions or length of the wires. Then at those times it cannot be assumed that the voltage and current are the same along the length of the wire, but instead they propagate like a wave down the wire. These effects are particularly evident when switching times are increasingly fast and the inductance dominates the delay behavior, especially when resistance is low, like on global metal lines which are much wider. Then interconnects behavior follow the transmission line equations (or telegrapher's equations):

$$\frac{\partial V(x)}{\partial x} = -(R + j\omega L)I(x) \text{ and } \frac{\partial I(x)}{\partial x} = -(G + j\omega C)V(x)$$

and combined they make:

$$\frac{\partial^2 V(x)}{\partial x^2} = \Gamma^2 V(x) \text{ or } \frac{\partial^2 I(x)}{\partial x^2} = \Gamma^2 I(x)$$

with $$\Gamma = \sqrt{(R+j\omega L)(G+j\omega C)}$$

and the characteristic impedance is:

$$Z_0 = \sqrt{\frac{R + j\omega L}{G + j\omega C}}$$

Characteristic impedance is the ratio of the instantaneous voltage and current at a point on the wire. If there are discontinuities in the characteristic impedance on any point of the wire, then signal reflections could occur and cause signal integrity issues and power transfer issues.

Transmission lines are typically divided into two low-loss lines and lossy lines, where low-loss lines have negligible resistance and conductance (G), and in lossy lines the resistance and conductance cannot be neglected. Most dielectric materials used in IC chip manufacturing are insulators, the conductance is very low since they are insulators, except for cases when water vapor is introduced into the dielectrics. And also when resistance is very high, inductance is comparatively low at that frequency, the circuits are then dominated by the RC effects and not the LC effects.

As the wires increase in width, the resistance goes down, and global wires typically have less resistance per unit length. Actual total resistance values for M1-M3 wires are scaled by their length, so for M1-M3 wires which are much shorter, for lengths of around 1 gate pitch (now typically the same as the M1 pitch), the total actual resistance value is much less.

Resistivity is also influenced by geometry when electrons are now also encountering the boundaries of the conductor in their mean free path due to the much smaller dimensions of the conductor. Resistance used to be calculated just by the bulk resistivity, which is 1.7 µΩ-cm for copper.

Also another issue with resistance is with the use of copper interconnects, since the dual damascene process had to be implemented, barrier metals like cobalt, titanium, titanium nitride, tantalum, tantalum nitride are used to prevent copper ions from diffusing into the silicon dioxide or silicon and degrade the insulation of the dielectric. The barrier metals typically have good conductivity but the resistivity of the metals is still higher than copper, like tantalum has a resistivity 10 times higher than copper and so increases the resistivity of the interconnect.

Also at higher frequencies, the resistance increases as the current does not tend to flow uniformly through the whole conductor, but instead flow on the surface which reduces the total surface area. This is expected to be an issue for larger wires, which at the frequencies used are much larger than the skin depth so the effective surface area is reduced. On the M1 and intermediate wires or minimum global pitch the skin depth is as wide as the wire, and so does not have an effect. The equation for skin depth is:

$$\delta = \sqrt{\frac{\rho}{\pi f \mu}}$$

Copper at 1 Ghz has a skin depth of 2 um.

Inductance (self-inductance) is also calculated from the geometry of the conductor and its distances to other inductors. Self-inductance is generally negligible because most materials used in IC chip manufacturing have a magnetic permeability of vacuum. Mutual inductance depends highly on the current return path. Mutual inductance describes the inductive coupling that will be seen degrading signals. The current return paths are not set and the current will return on the paths that have the lowest impedance (Z=R+jwL). In VLSI logic design, data paths are connected to the gate port of the CMOS and so are terminated by capacitors. Current can also return on adjacent wires, parallel power supply buses, or the substrate. Therefore typically at lower frequencies global signal lines which have much lower resistances will have the lowest impedance and will be the sources of the current return. At higher frequencies, however, the lower impedance return paths may be on smaller signal wires, which may be closer to each other. So therefore the area of the influence of the magnetic flux generated by that loop that couples to the other loops of wires may increase or decrease along with the change of frequency.

Inductance, L, is also multiplied by the frequency in the impedance, jwL, so at higher frequencies the inductance increases. The wire can no longer be considered in the RC regime, but modeled as a transmission line if the time of flight, length divided by the propagation velocity, is longer than the rise time of the driving transistor, which is expressed as:

$$t_r < 2.5 \frac{L}{v_p}$$

Loss is generally not an issue for on-chip interconnects because the length of the majority of wires is too short. It is not the loss limiting the clock speed, rather than it is the RC delay that limits the clock speed.

The loss tangent is generally calculated with this equation:

$$\tan \delta = \frac{\omega \epsilon'' + \sigma}{\omega \epsilon'}$$

but ignoring the imaginary part of the dielectric constant the loss tangent is calculated for transmission lines as:

$$\tan \delta = \frac{ESR}{|X_c|} = \omega C \cdot ESR = \frac{\sigma}{\epsilon' \omega}$$

Silicon dioxide is an insulator and has a very low conductivity of $10^{-9}$ to $10^{-16}$ S/cm (varies with what process the silicon dioxide is made and its impurities, for films on doped silicon, the conductivity is higher), which brings its loss tangent per GHz (using keff=4.2 for silicon dioxide and the highest conductivity $10^{-9}$) to be: $4.28 \times 10^{-11}$ which is still very much less than 1 and the dielectric is considered low loss.

For low loss tangents (<<1), $\tan \delta \approx \delta$, then power attenuation would be characterized by:

$$P = P_o e^{-\delta k z}$$

Meaning the length at which it attenuates to $e^{-1}$ level, is $1/\delta k$, which for silicon dioxide is $4.85 \times 10^{11}$ m.

Compared with FR4, which has a conductivity that is largely frequency dependent so that at 1 Ghz the conductivity is $10^{-4}$ S/cm, the loss tangent is much higher. FR4 has a transition frequency at 10 Hz at which the conductivity goes up much higher.

Porous silicon dioxide materials can be expected to be even further insulating because of the inclusion of air pockets and so would also have lower conductivities, and thus lower loss tangents.

Conductance is also a measure of the dielectric loss of a material and for the parallel plate or microstrip configuration of the conductors on the IC chip. Some attempts at measuring the permittivity of low-k materials have also tried to measure the conductance but it was found that the metal loss greatly exceeds the dielectric loss, even at frequencies of 40 Ghz.

RC Delay calculated from the resistance and capacitance of the element is the measure of an element to discharge to 37% of its original charge. With interconnects, resistance and capacitance are modeled as lumped or distributed resistances and capacitances because the majority of the wire lengths inside of a chip are still much shorter than the signal wavelength and transmission line models are not needed. Therefore most of the wires on the IC chip are RC limited, and some wires may have some transmission line effects, particularly the global wires that are much longer.

RC delay in general prevents clocks and data from switching as fast and limits your clock speed. However since resistance and capacitance is dependent on the length of the wire, for shorter lengths, RC delay is very small. For longer wires like the global interconnects, RC delay becomes as much as the gate delay or many times more, further eating into timing budgets and limiting the clock speed. However, 1 mm wires, considered long wires, consist of less than 1% of the total interconnects distribution. But global interconnects have even higher aspect ratios (around 2.0 to 2.4) so cross talk still dominates the capacitance. For a chip with number of gates Ng, equal to 1 million, this is roughly 4 million transistors for 2007 32 nm technology, roughly a 2.7 mm$^2$ sized chip, and with very limited functionality. The cumulative interconnect length distribution density shows that interconnects less than 10 μm compose 98% of the interconnects on a chip with 1 million gates.

However with higher RC delay, it means more current (charge) would be needed to charge and discharge (switch) the circuit. Chip designers could use larger transistors to provide more driving current but instead they add more repeaters which are basically inverters on the interconnect line. Adding repeaters adds a little bit of delay but adds current to the signal line because of the pull-up and pull-down structure of CMOS logic.

Repeaters are merely inverters placed in the timing path to manage clock skew due to varying lengths of the paths. Repeaters are not flip-flops that are clock gated, but merely adjust the skew on data path by a few picoseconds, so that data or clocks arrive at all of the load gates/flip-flops at the same time. By splitting up the wire segments into shorter lengths, the RC delay due to the interconnects is managed. However RC delay is not affected significantly by capacitance reduction, but resistance contributes to the majority of the RC delay and capacitance reduction for using low-k materials mitigates the rising resistance.

The crux of the matter is that RC delay has not decreased at all with the lowering of capacitance because of the higher growth rate of resistance. Also with scaling of interconnect widths, the interconnect lengths have not scaled much because IC chip designers have just added more gates and more functions. Resistance is also not scaling linearly anymore due to added effects of surface scattering and line-edge roughness and copper barrier metal thicknesses, which all complicates the linear dependence of $R=\rho l/A$.

Therefore it is not possible to get rid of repeaters by using air-gap technology since resistance is the major contributor to the RC delay. However repeaters will not solve the issue of long-lines running into transmission line effects as although repeaters lessen delay, they are not clocked elements. Therefore IC chip designers have tried to design digital circuits that do not need to travel far distances like multi-core architectures.

Most effort in terms of repeaters has been put to maximize the decision algorithms on how many repeaters should be to put on an interconnect line so that the power penalty due to the repeaters will not be significant.

Each buffer uses power to operate, and increases the total time the signal takes to move along the wire because the signal is "held up" a small amount of time at each buffer. There are a few different methods currently attempting to battle the problem of interconnect speed and power consumption, usually by reducing the number of buffers needed along a signal line. All of the current methods suffer from significant drawbacks.

One current method of reducing the number of buffers is to use a low-k dielectric material as the layer between the metal interconnects, instead of the standard $SiO_2$. As a signal moves along a wire, some of its power is lost to the surrounding dielectric material. A lower dielectric constant means that less power is lost to the surrounding material, meaning fewer buffers are needed to strengthen the signal. However, the low-K dielectric materials require using many types of barriers which increases fabrication costs, and low-k materials also tend to be more porous and poor heat conductors.

One method that had been explored to reduce signal line capacitance is differential signaling. With differential signaling, a signal is placed on one line and simultaneously duplicated but opposite voltage on the other line. Then at the receiver end, the voltage is subtracted and the difference is read to give the signal again. This makes differential signaling less sensitive to noise than single-ended lines. Though the noise margin is doubled and ground offsets are also do not matter because of the subtracting operation that happens at the receiver. Also with differential signaltng lower signal swing is also needed because the receiver looks at the difference in voltages, which will need lower supply voltages to be used.

Also with differential signaling, since typically the two lines are balanced (meaning they have the same impedance to ground), it is less susceptible to electromagnetic interference, and inductive coupling. Differential lines have much more noise immunity because of the differencing at the receiver and since both lines are affected by about the same inductive coupling, then there is little difference between the two signals and the signal is transmitted cleanly.

Having two lines also has the advantage of supplying a nearby return path for every signal, so noise and signals are more isolated from each other and not coupled into nearby signals. Also it becomes more isolated from supply lines and the associated noise of supply lines.

Since the voltages are equal and opposite, the capacitance is constant, and is lower than parallel single-ended lines, where the Miller effect doubles cross-capacitance. Differential lines also have predictable and constant cross-capacitance in between the lines, compared to data-dependent cross-capacitance single-ended lines in CMOS. As a result of higher noise resistance and lower capacitance of differential lines, differential lines can typically have much faster speeds than single-ended lines. However, capacitance can also come from other differential lines or single-ended lines near the differential lines and can be.

However, for CMOS differential lines they will add an extra penalty of two times the number of nets that need to be routed, meaning that 2*N (where N is the number of lines) routing lines will now have to be routed in the same space. Also at each gate, the drivers will have to be modified to also provide the differential signal and receivers will also have to be placed to take the differences in the voltage to get the signal out again for the logic. To determine if all signal lines are to be replaced with differential lines or only some will also require much more design management. Clock jitter and clock skew could still significantly affect differential signal lines.

As with all differential signal schemes, there is always current flowing through one of the lines, so there is a higher static power consumption, compared to CMOS, which only dissipates power in a 1 to 0 transition. Static power consumption of differential signal lines will depend on what the load resistance is on the receiver and resistance of the wire. LVDS uses a common mode voltage of 1.2V which can be driven by CMOS circuits with VDD of 2.5V or lower. Static power consumption across the load resistor on LVDS is 1.2 mW and the low differential voltage, 350 mV, decreases the dynamic power consumption.

Differential signaling has been applied widely off-chip and quite a few standards exist for them. Most of them are high-voltage schemes with the exception of LVDS which uses low-voltage. However, off-chip they can travel quite far distances and at high speeds. Current standards include: LVDS, differential ECL, PECL, LVPECL, RS-422, RS-485, Ethernet physical layers, PCI Express, USB, serial ATA, TMDS, FireWire and HDMI.

Currently on-chip there has been no use of differential signaling, although there have been several designs and several patents. It seems there are many ways to design CMOS circuits to provide differential signals, like the one disclosed in U.S. Pat. No. 6,294,933 which is a fairly simple circuit for the driver, with feed forward capacitors, a receiver, and uses VDD as the reference voltage instead of requiring an outside reference voltage. Using the sizing of transistors, it is possible to make a source drain resistance that will make the signal swing around VDD/2, and with a signal swing of less than ¼ VDD.

It seems differential signaling would be most useful on clock nets which are most active and have highest frequency.

Most of the power is saved from the reduction of the signal swing to less than half of the supply voltage. A differential circuit has some static power consumption due to some current always being on the line flowing through the open transistor, even if no signal is being transmitted, the logic state for one line is zero and the other is one. But, at higher frequencies, the total power consumption is less than total power consumption of single ended lines because of the massive reduction in the signal swing voltage (to 25% of the original VDD).

There has been much interest in developing side-air gaps and several papers have been published and it has been mentioned as a possible technology for the future roadmap by ITRS. However, side air-gap technology also poses some integration issues with via mis-alignment leading to chip failure, and also the use of extra masks to limit the air-gaps and integration of new materials like polymers as sacrificial materials as they will modify the copper dual-damascene process.

Another method that is being explored to increase interconnect speed is using optical signals in part, instead of only metal transmission lines. Optical signals are already used in the off-chip case, but on-chip placement faces significant challenges and drawbacks. Primarily, adding optics makes a chip far more complex, and increases difficulty of manufacture and manufacturing cost, it also greatly increases the power needed for the interconnect system.

One example of an on-chip optical interconnect is disclosed in the U.S. Pat. No. 6,147,366. For an optical interconnect, it is necessary to provide a transmitter and a receiver, preferably located on-chip. Silicon can not be used as an emitter, so the emitter must be formed of some other material, or in some cases the light is provided off chip. Then an optical interconnect requires wave guides, guiding the optical signal to its receiver, which further increase the complexity of the chip. Finally by adding the receiver, the overall complexity of the chip is very significantly increased over having a simple metal wire transmit the signal. Both the transmitter and receiver also require power to operate, which is a major drawback compared to a wire which requires little or no power to transmit a signal.

BRIEF SUMMARY OF THE INVENTION

Accordingly, it is an object of the invention to provide a technique to reduce the effective dielectric constant and reduce effective dielectric loss of vias.

It is an object of this invention to use an inhomogeneous dielectric system to reduce the effective dielectric loss and effective dielectric constant of the dielectric system.

According to the invention it is an object to provide a via interconnection structure where a portion of the signal (electromagnetic wave) is allowed to pass through air or dielectric material, resulting in dielectric loss less than the loss resulting from the dielectric material on which the signal line is laid out.

According to the invention it is an object to provide a via interconnection structure where the signal is shielded from its surroundings by at least one ground via running parallel to the signal via.

Another object of the present invention is to provide an interconnection structure for on-chip interconnection in a way that is compatible with available IC fabrication technology.

Another object of this invention is to provide a fabrication technology of the technique implementable in an on-chip interconnect using standard fabrication process.

According to the invention, a high speed electronics interconnection system for interconnecting two or more on-chip electronic elements, said interconnection system comprising:
  at least one electrical signal plane comprising at least one electrical conductor for carrying a electrical signal from one electronic element to another; and
  a dielectric system, wherein one side of the at least one electrical signal plane laid on the dielectric system, the dielectric system comprising,
    at least one dielectric layer;
    at least one signal via connected to the at least one electrical conductor; and
    at least one ground via connected to a ground plane and oriented to be parallel with the at least one signal via; such that the connection of two or more electronic elements via the interconnect system reduces the microwave loss, thereby increases the signal carrying capacity of said electrical signal plane(s).
  the interconnect system comprises:
  (i) single or multiple electrical conductors for carrying the electrical signal from one electronics elements to another and vice-versa for electrical communication;
  (ii) a dielectric system comprising a dielectric material which may have open trenches located parallel to the signal vias;
  (iii) at least one ground via connected to a ground plane and parallel to a signal vias;
  Wherein the ground vias may surround the signal vials in part in order to providing shielding from the surroundings and the shape of the trench could be rectangular or square or circular or any shapes convenient for manufacturing, and covering more, less, or the same length as the metal conductor vias carrying the signal.

According to this invention, the effective loss tangent and effective dielectric constant of the dielectric system is reduced, which reduces the power lost to the dielectric layer and increases the interconnect's bandwidth for high speed electrical signal propagation, and also reduces the signal propagation delay.

The invention connects the signal line of one electronic element to another electronic element for communication without sacrificing each electronic element's signal speed. This invention could be easily implemented with today's manufacturing technology. The methods described in this disclosure enable fabrication of electronic interconnects in a cost-effective manner and are suitable for practical application.

Other objects, features, and advantages of the present invention will be apparent from the accompanying drawings and from the detailed description that follows.

BRIEF DESCRIPTION OF THE DRAWINGS

The invention will be explained in more details in conjunction with the appended drawings wherein:

FIG. 3A is top-down view of a possible embodiment of the present invention, showing only the vias and not surrounding materials in order to illustrate a possible arrangement of signal and ground vias.

FIG. 3B is the cross sectional view which relates to FIG. 3A showing the orientation of the vias in 3A with the surrounding parts of the semiconductor device, according to one possible embodiment of the invention.

DETAILED DESCRIPTION

Figure 1A:
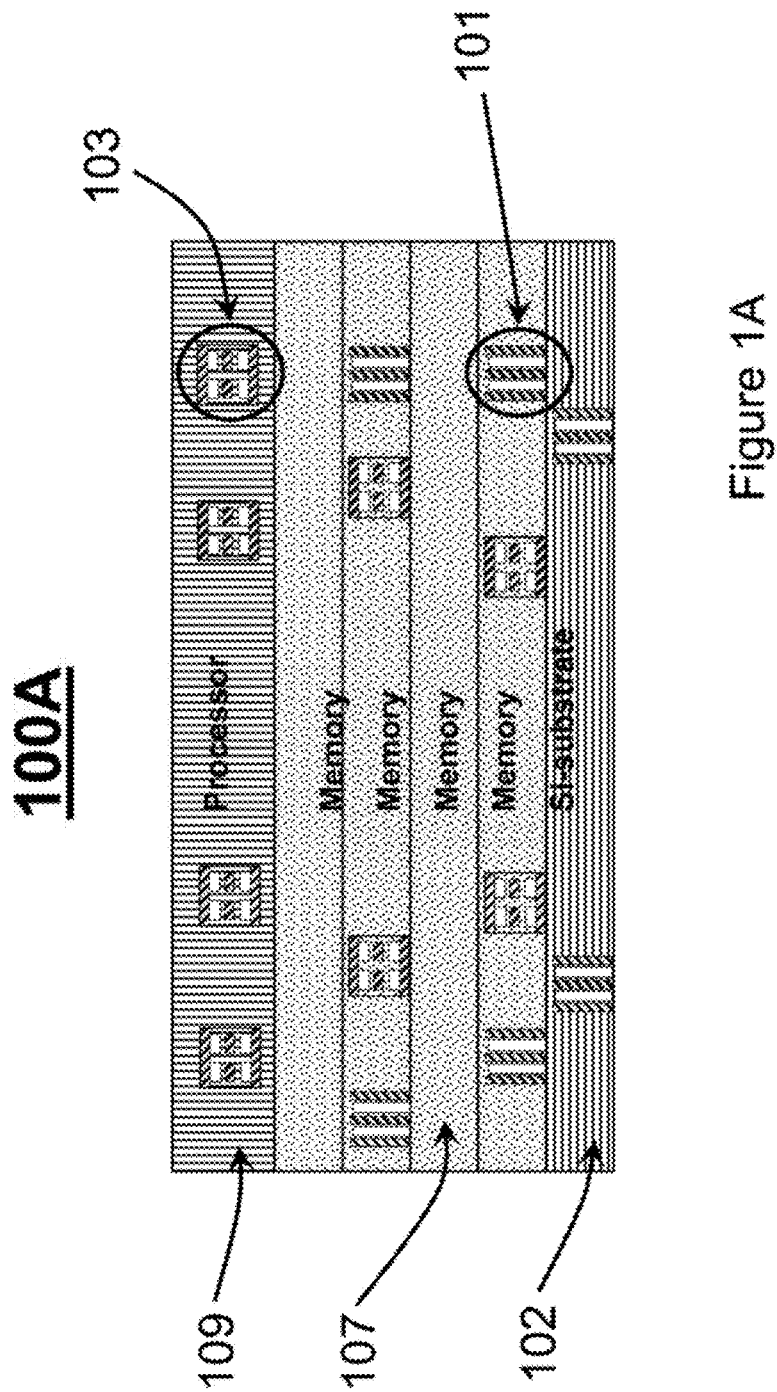
FIG. 1A is a cross sectional view of a 3D IC structural representation of a first embodiment of an integrated circuit constructed according to the principles of the invention, illustrating trenches and grounding vias surrounding signal vias. For simplicity, only a few layers of the whole semiconductor device are shown.

The specific embodiments for carrying out the present invention will be described in turn with reference to the accompanying drawings. In the following description, the same reference numerals denote components having substantially the same functions and arrangements, and duplicate explanation will be made only where necessary.

As an electrical signal inside a semiconductor device propagates along an electrical conductor, for example, a signal wire, it loses power and eventually dies before reaching its destination. The loss is in part due to the close proximity of other wires, which interferes or causes "cross talk" between the wires, weakening each signal. The loss is also due in part to the capacitance of the dielectric material upon which the signal wire rests. The general situation is that the dielectric material is $SiO_2$ having a dielectric constant of about 3.5. By adding open air trenches to the dielectric material, the present invention can significantly reduce this dielectric constant. By surrounding the signal wire with grounded wires, the present invention also reduces the cross talk between wires. When the dielectric constant is lowered, there is less capacitance between the dielectric and the signal wire, and therefore less power loss.

With current aspect ratios of wires' height being much taller than width, cross-capacitance dominates the capacitance calculations, contributing up to 70% of the total capacitance. Additionally the length of wires at lower levels is so short that RC delay does not become a design bottleneck at the M1-M3 levels. Instead the RC delay bottleneck comes from the minimum pitch global interconnects that might have a few data paths that span the length of the chip. Therefore it is the length of global interconnects that is still causing the RC delay bottleneck. Additionally, at the global interconnect level, because of the larger size of the wires and lack of routing space, wires are routed densely and at minimum pitch, therefore making cross-capacitance the dominant capacitance contribution.

Adding air-gaps around signal vias between the metal layers significantly reduces the cross-capacitance and therefore reduces the total capacitance. But adding air-gaps and surrounding the vias with grounded vias reduces the capacitance the most.

One possible embodiment is adding side air-gaps around the vias and partially encircling the vias with grounded vias in silicon dioxide, and not using low-k material. This can lower the effective dielectric constant to lower than with homogenous low-k dielectric materials till the year of 2012 when the dielectric constant of low-k materials will catch up to the effective dielectric constant that can be made by air-gaps (as projected by ITRS). It is better to preclude the use of low-k materials, which is an attractive option though, since using low-k materials requires using many types of barriers and low-k materials also tend to be more porous and poor heat conductors.

In the preferred embodiments described below, the dielectric materials include a wide range of materials known to those skilled in the art, and sold under different trade names. For example, ceramic materials including high frequency laminate marketed under the Trademark name Duroid™, AlN, $Al_2O_3$, Mullite ($3Al_2O_3$: $2SiO_2$), $SiO_2$, Silicon nitride, Silicon carbide, Silicon-Oxy-Nitride, BeO, Cordierite (magnesium iron alumina silicate), BN, glass (with different compositions), epoxy glass, such as FR4, CaO, MnO, ZrOz, PbO, alkali-halide (e.g. NaBr, NaCl) BN, BeO, etc., and different types of polyimide and benzocyclobutenes (BCBs) having desirable dielectric properties are equally applicable. Other polymeric dielectric materials also include, but are not limited to, polytetrafluoroehtylene (PTFE) marketed under the Trademark name TEFLON™, liquid crystal polymer, epoxy, parylene, silicone-polyimide, silicone-gel, fluorinated ethylene propylene copolymer. It also includes elastomers (e.g. silicone elastomer), monomers, and gels. Dielectric materials which can be made using high temperature ceramics processing or IC fabrication processing, also are included in this category. All standard polymers can be available from the standard manufacturers for example, DuPont, Hitachi-Chemical, Mitsui, and Mitsubishi-Chemical Industries. The liquid crystal polymer is marketed by Gore-Tex of Japan.

FIG. 1A depicts a first embodiment of the invention, where there are three kinds of layers shown as a cross sectional view. The bottom layer 102 is the substrate which contains electrical devices such as transistors, not shown. The middle layers, 107 are memory layers. Finally, the top layer 109 is the processor layer. For simplicity, only a few layers are shown, although many more may be added and stay within the scope of the present invention. A few examples of a shielded vias arrangement 101 are shown in various layers, however many more are not shown for simplicity. Also for simplicity, though some signal wire arrangements 103 are shown, many more can be added as necessary.

Figure 1B:
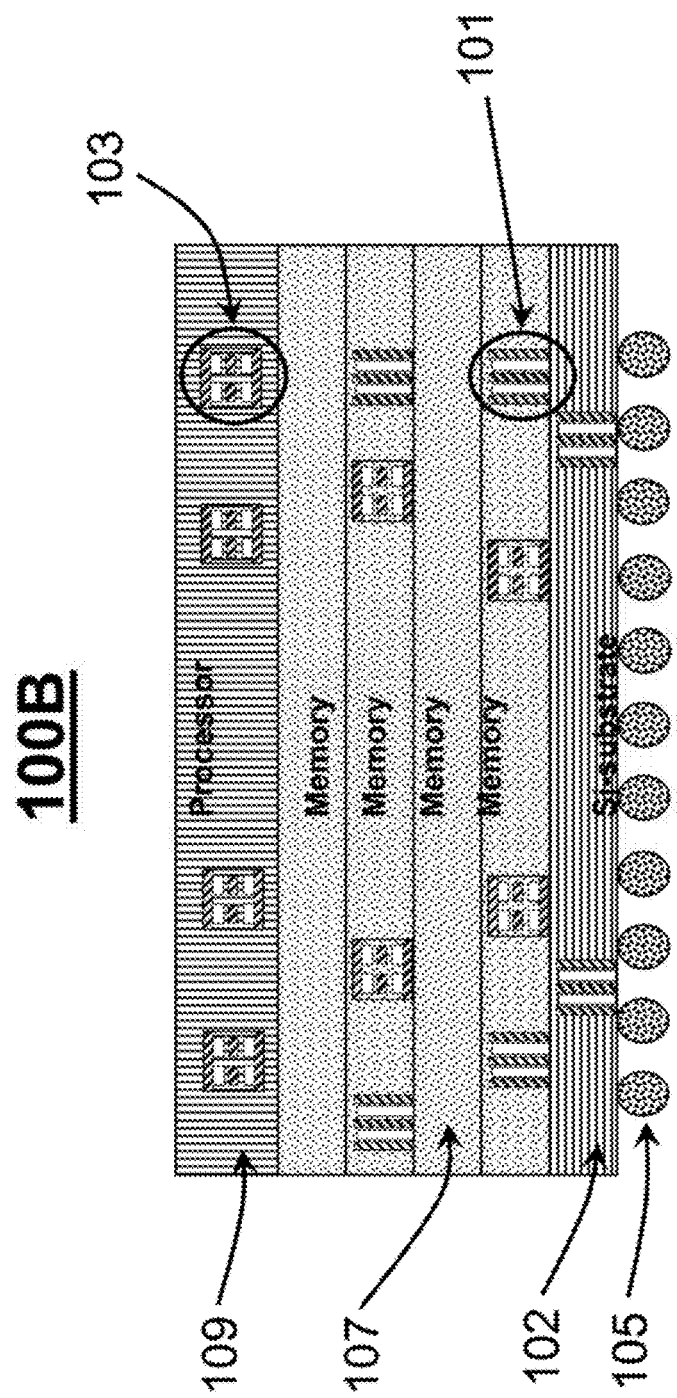
FIG. 1B is the same as FIG. 1A except that balls have been added along the bottom of the device to indicate a possible orientation of one embodiment of the present invention.

FIG. 1B is the same as FIG. 1A except that balls 105 have been added along the bottom of the device to indicate a possible orientation of one embodiment of the present invention.

Figure 2:
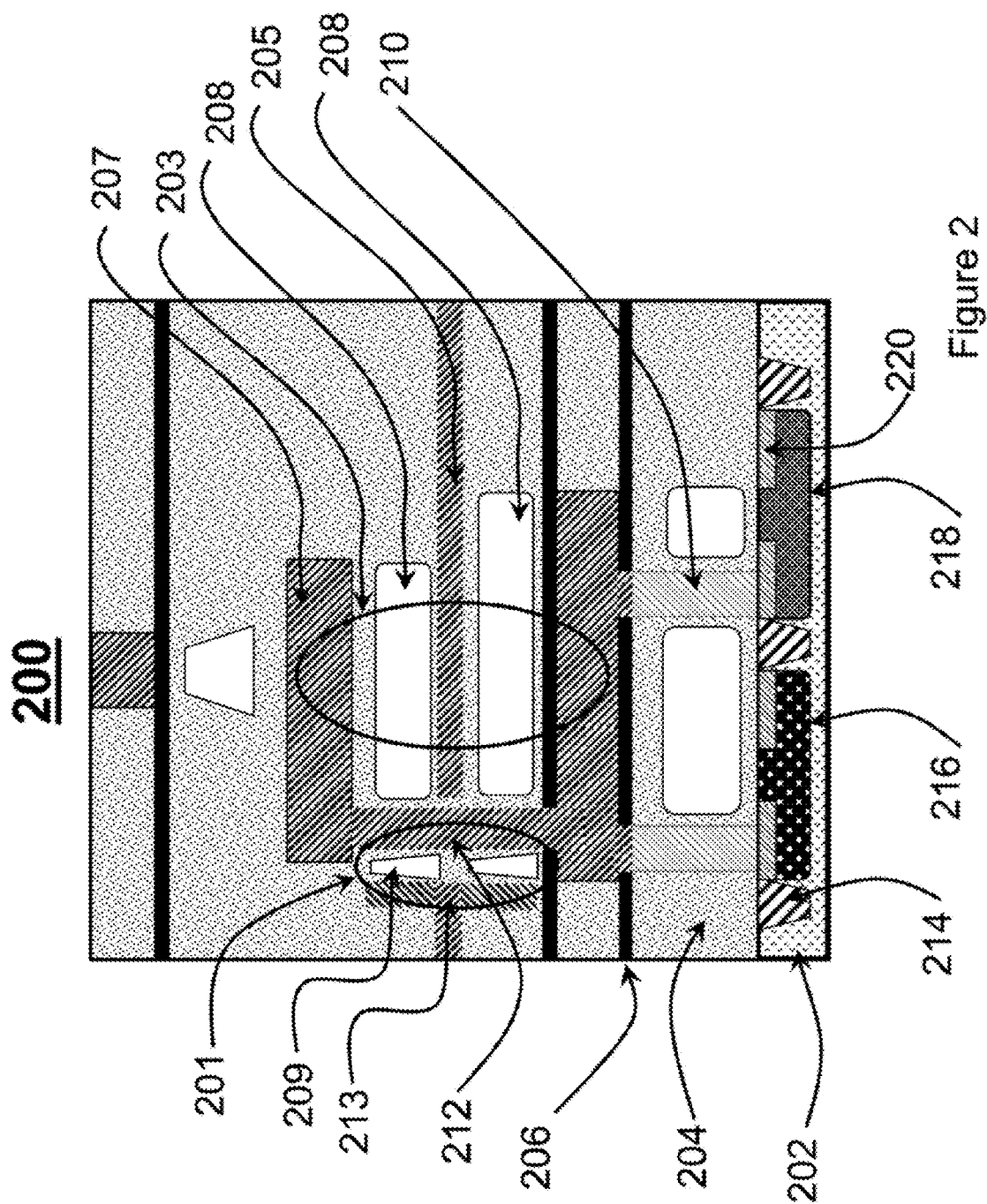
FIG. 2 is a cross sectional view of a structural representation of a possible embodiment of a semiconductor device constructed according to the principles of the invention. Two circled areas are indicated to show that they may be related to the circled areas in FIGS. 1A and 1B. For simplicity, only a few layers of the whole semiconductor device are shown.

FIG. 2 depicts a possible embodiment of the invention, formed according to the sacrificial process, where there are open air trenches 209 in the dielectric layer 204 which run parallel with the signal via 212. 213 is a grounded signal via, running parallel to the signal via 212. 205 is the ground plane, and 207 is the electrical signal wire. Open air trenches 208 in the dielectric layer run parallel to the electrical signal wire. For reference, the circled area 201 is an example of the shielded vias arrangement 101 found in FIG. 1. Also for example, the circled area 203 is an example of the signal wire arrangement 103 found in FIG. 1. 202 is the device layer, composed of transistors 216, 218, and others not shown, embedded on a silicon wafer, and separated by insulators 214. 220 are the electrical contacts on each transistor. 210 are the vias which connect the electrical contacts to the signal wire

207. 212 is the signal via connecting the transistors to the signal planes. 206 is a silicon nitride stop layer used for the copper damascene process.

In another possible embodiment, the open trenches 209 could also be filled with a liquid coolant, a porous material, or be used as waveguides to allow an optical signal to pass though. The liquid coolant would be advantageous because it would help dissipate the heat of the nearby signal lines of powered elements. A porous material could be advantageous because, while it may not lower the dielectric constant as much as an open trench, it will provide more structural support. Finally, allowing an optical signal to pass through the trench would be advantageous because it would allow for a superior usage of space, resulting in an ultimately smaller, more efficient chip.

FIG. 3A is top-down view of a possible embodiment of the present invention. The central via shown 312 is the signal via, while the surrounding vias 313A and 313B are all grounded vias, connected to a ground plane, not shown. This view shows only the vias and not surrounding materials in order to illustrate a possible arrangement of signal and ground vias.

FIG. 3B is the cross sectional view which relates to FIG. 3A showing the orientation of the vias in 3A with the surrounding parts of the semiconductor device, including the surrounding elements of the IC. The signal via 312 is surrounded by the ground vias 313A and 313B. 304 is the dielectric material, some of which may be deposited inside the open trench 309 as shown at 317. As a result, the open trench 309 may be narrow at the bottom, shown at 315. For reference, a nearby signal wire 312 is shown with a parallel open air trench 308.

Figure 3C:
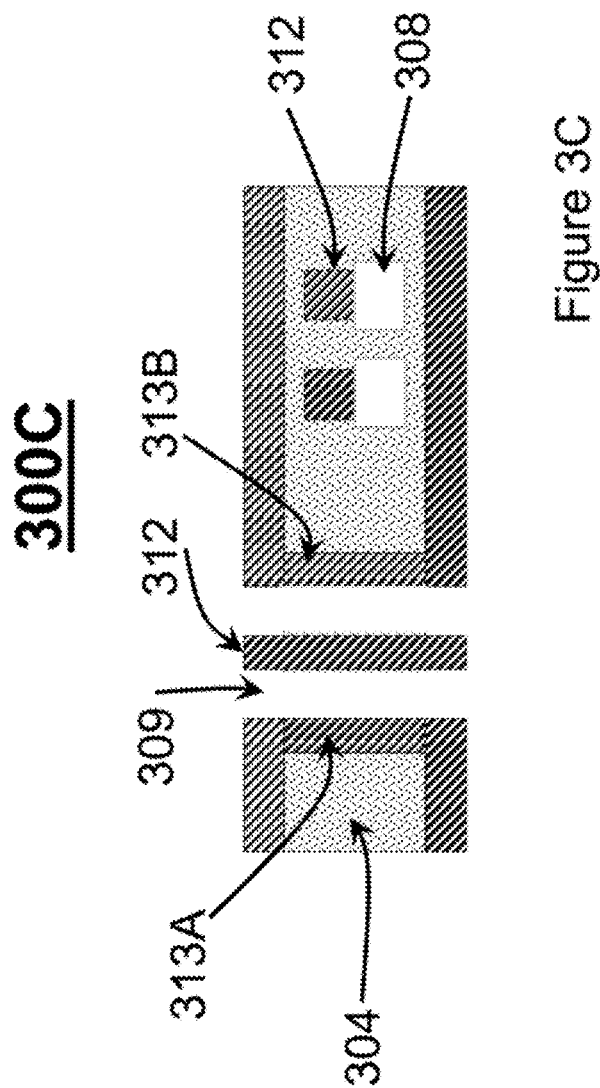
FIG. 3C is the cross sectional view of a different possible embodiment which relates to FIG. 3A showing the orientation of the vias in 3A with the surrounding parts of the semiconductor device.

FIG. 3C is the cross sectional view of another possible embodiment which relates to FIG. 3A showing the orientation of the vias in 3A with the surrounding parts of the semiconductor device. The only difference between FIG. 3C and FIG. 3B is that in this embodiment, there is no dielectric material deposited inside the open trench 309.

This arrangement is advantageous because as a signal travels along a signal via 312, a portion of the surrounding electromagnetic wave travels through the parallel trench 309 instead of through the dielectric material 304. Open air has a much lower dielectric constant than the dielectric material, so the effective dielectric constant of the combined system of trenches and dielectric material is much lower than it would be with the dielectric material alone. Because the effective dielectric constant of the surrounding environment is so much lower, there is a much lower capacitance between the via 312 and the surrounding environment. Lower capacitance means less power is lost from the signal.

It is important to note that this invention directly relates to the capacitance between the vias and the surrounding environment. Even if there was only a single signal wire passing through a region of dielectric material, the addition of trenches above and below the signal wire would significantly decrease capacitance and decrease power loss.

In another possible embodiment, the open trenches 309 could be filled with a liquid coolant, a porous material, or be used as waveguides to allow an optical signal to pass through. The liquid coolant would be advantageous because it would help dissipate the heat of the nearby signal lines of powered elements. A porous material could also be advantageous because, while it may not lower the effective dielectric constant as much as an open trench, it will provide more structural support. Finally, allowing an optical signal to pass through the trench would be advantageous because it would allow for a superior usage of space, resulting in an ultimately smaller, more efficient chip.

This arrangement is also advantageous because as a signal travels along a signal via 312, there may be some cross capacitance between the signal via 312 and nearby signal wires or other vias, not shown. By surrounding the signal via 312 with grounded vias 313A and 313B, the signal via 312 is effectively shielded from the influence of nearby signal wires or vias.

Figure 4:
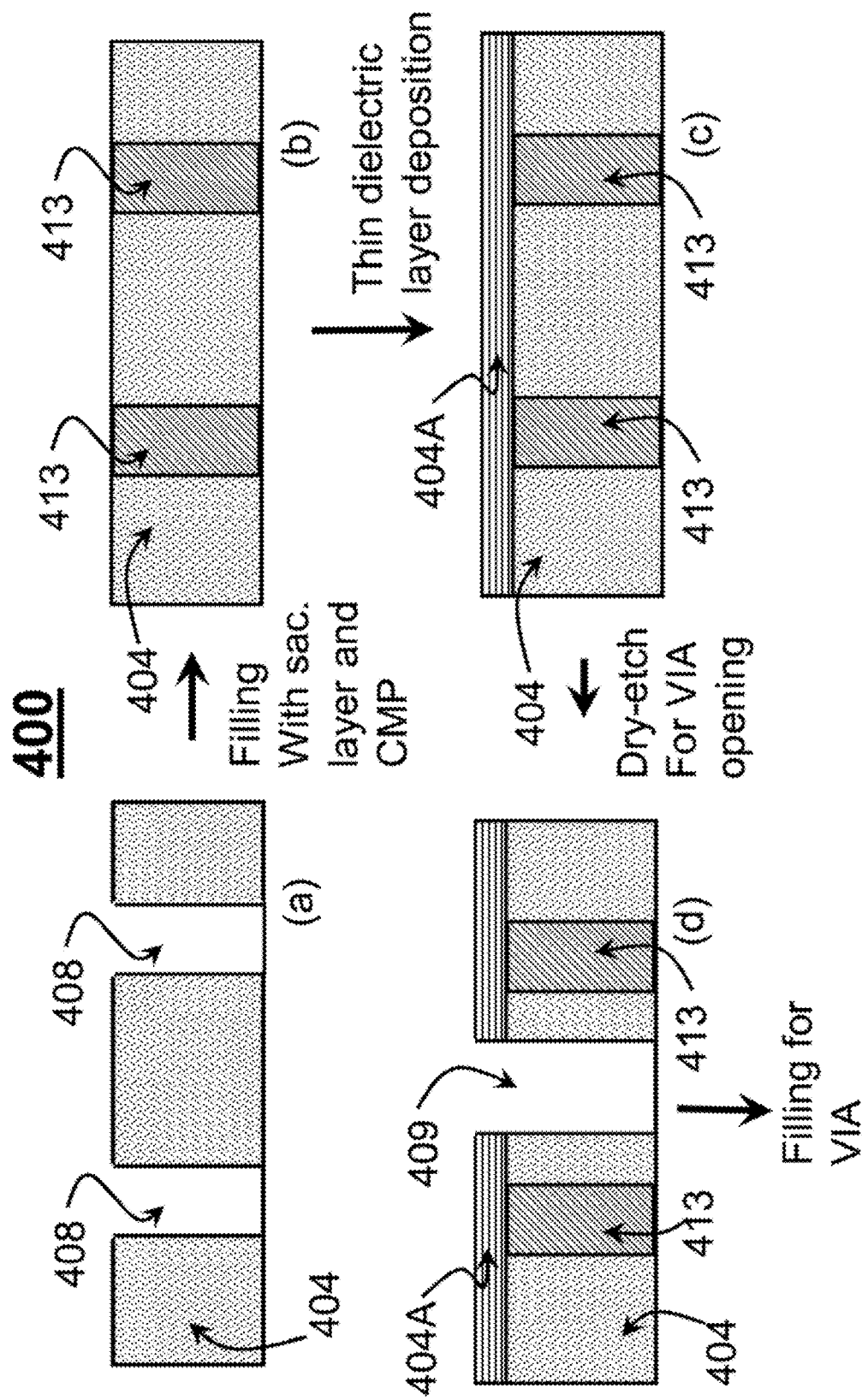
FIG. 4 is a structural depiction illustrating the sacrificial fabrication process of one embodiment of the present invention.
Figure 4:
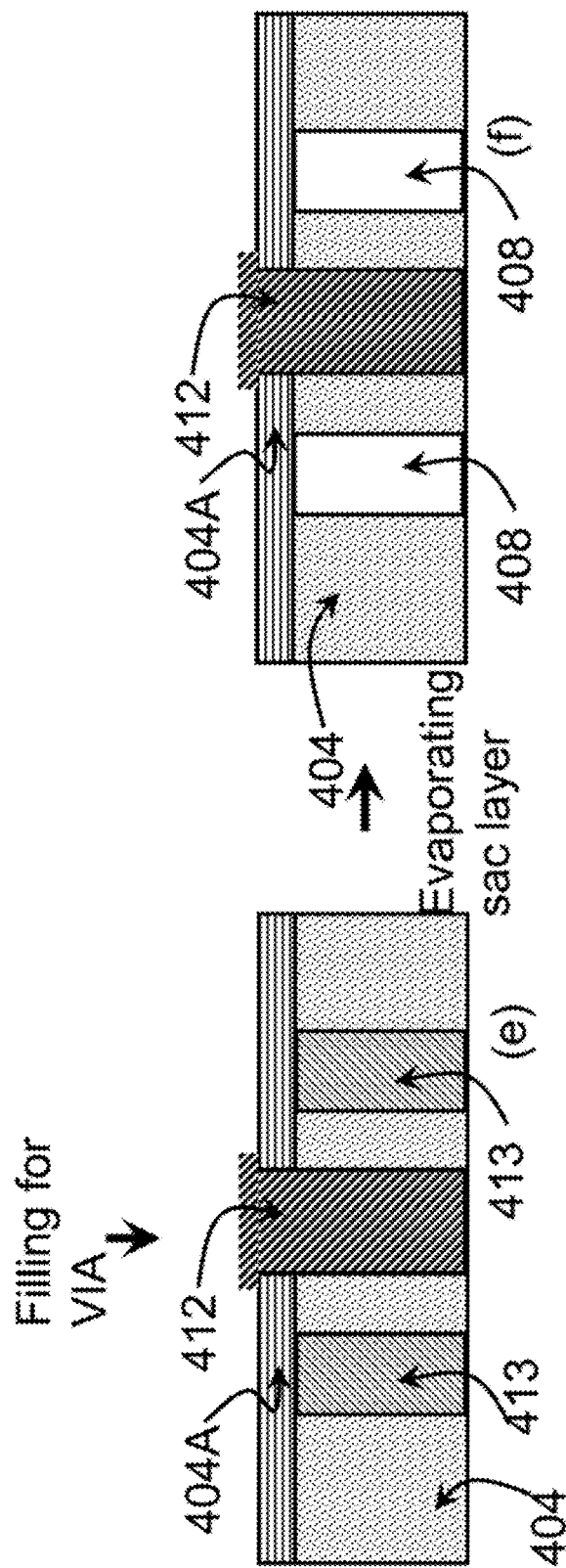

FIG. 4 depicts the sacrificial process for fabricating one embodiment of the present invention. Step (a) shows a sample portion of a sample layer of one embodiment of the present invention. 404 is the dielectric layer using dielectric material such as $SiO_2$. First, a dry etching process is used to create voids 408. Next, in step (b), the voids 408 are filed with a sacrificial material 413, and chemical mechanical planarization (CMP) is used to smooth the top of the layer. In another embodiment of the invention, it is possible to use a porous material in place of the sacrificial material. The porous material would be full of micro voids, and therefore would lower the effective dielectric constant of the environment surrounding the vias. In that case it would not be necessary to heat the layers later to remove the porous material as with the sacrificial material. Next, in step (c), a thin layer 404A is deposited, normally 500 to 1000 angstroms thick. This layer may or may not use the same dielectric material as used in dielectric layer 404. At this point, one possibility is to heat the layers and evaporate the sacrificial material (this option is not shown). Next, in step (d), a via opening 409 is etched through dry-etching process. Next, in step (e), a metal material is deposited to create a via 412. The heat of depositing the metal material may also cause the sacrificial material 413 to evaporate. Finally, as shown in step (f), the layers can be heated to evaporate the sacrificial material 413 leaving open trenches 408 surrounding the via 412. These open trenches 408 effectively lower the effective dielectric constant of the environment surrounding the via 412.

Figure 5:
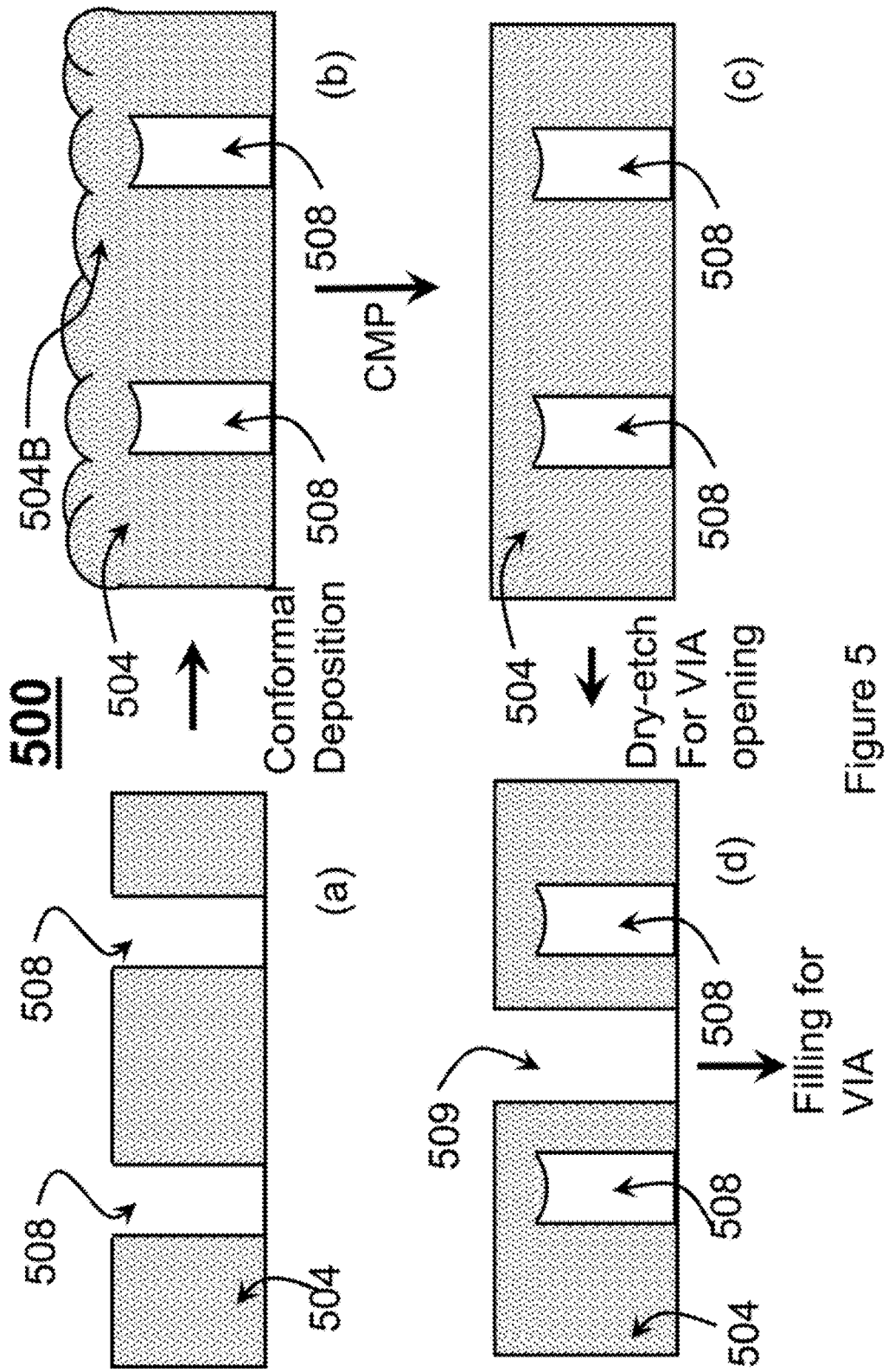
FIG. 5 is a structural depiction illustrating the conformal fabrication process of one embodiment of the present invention.
Figure 5:
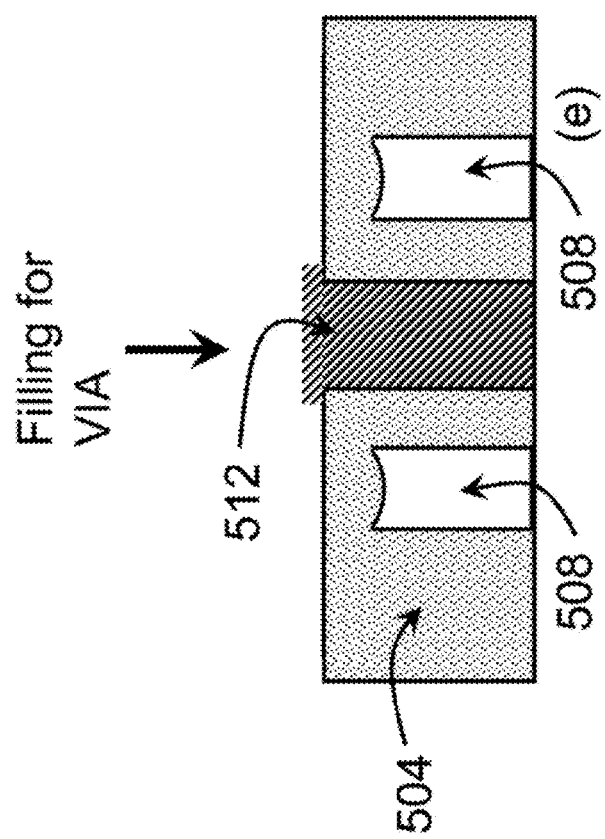

FIG. 5 depicts a conformal process for fabricating one embodiment of the present invention. Step (a) shows a sample portion of a sample layer of one embodiment of the present invention. 504 is a dielectric layer using dielectric material, such as $SiO_2$. First, a dry etching process is used to create voids 508. Next, in step (b), the top of the voids 508 and the dielectric layer 504 is covered with a conformal layer of dielectric material 504B, which does not substantially enter to fill the voids 508. Next, as shown in step (c), CMP is used to smooth the top of the layer. Next, in step (d), an opening 509 for the via is etched. Finally, in step (e), a metal material is deposited in the opening 509 to create the via 512. These open trenches 508 effectively lower the dielectric constant of the environment surrounding the via 512.

An additional embodiment of the present invention is to add the above described air trenches and ground vias to on-chip vias which use differential signal lines. In contrast to a standard one directional signal wire, differential signal lines uses two close proximity parallel wires, and requires a constant amount of static power to operate, even when no signal is being sent. The main advantage of differential signal lines is that two wires couple to each other, which minimizes or prevents signal slowing, power draining capacitance for other nearby wires. Because a differential configuration reduces power drain, it is advantageous to utilize this configuration in conjunction with the present invention and therefore maximize the reduction in power over the standard CMOS configurations.

It should be understood alternative embodiments of the present invention include open trenches mentioned could be filled with a liquid coolant, a porous material, or be used as waveguides to allow an optical signal to pass though. The liquid coolant would be advantageous because is would help dissipate the heat of the nearby signal lines of powered elements. A porous material could also be advantageous because, while it may not lower the dielectric constant as much as an open trench, it will provide more structural support. Finally, allowing an optical signal to pass through the trench would be advantageous because it would allow for a superior usage of space, resulting in an ultimately smaller, more efficient chip.

It should also be understood that all or some of the dielectric materials mentioned could also be replaced with low-k materials in order to further reduce the dielectric constant.

The present invention has been described above by way of specific embodiments. However, those skilled in the art can reach various changes and modifications within the scope of the idea of the present invention. Therefore it is to be understood that those changes and modifications also belong to the range of this invention. For example, the present invention can be variously changed without departing from the gist of the invention, as indicated below.

According to the present invention, it is the object to provide the interconnects technique by which the microwave loss can be reduced and then increase the bandwidth of the interconnects. It is also the object to use any dielectric material (including conventional dielectric material and the manufacturing technology thereof) in the technique and could increase the bandwidth tremendously. For simplicity of drawings, preferred embodiments are described mostly considering the microstrip line configuration. However, all transmission lines configurations such as strip line, coplanar line with single or multiple signal lines (including differential line) are also covered by this invention.

Several preferred embodiments for vias are described considering the microstrip line configuration with opened trenches or the dielectric periodic structure consisting of the cylindrical (spherical) air holes arrays or comb-shaped dielectric. All transmission lines configurations as mentioned earlier are covered under this invention. In the case of the trenches, all kinds of shapes are covered by this invention or fall within the scope of this invention such as square, circular, or rectangular or any shape convenient to manufacture. In the case of the air-holes periodic structure, the shape of each cell could be any type such as square, or any polynomial shape, and those can be filled up with dielectric material having lower dielectric constant than the dielectric substrate.

In the preferred embodiments, for simplicity of drawings most of the surrounding structures of the high speed signal lines are considered as having open trenches, or periodic air-holes structure or comb-shaped dielectric structure. In on-chip interconnects, the configurations or mixes of such configurations can also be used in the multi-layered interconnects.

In the preferred embodiments, as the open-trenches or air holes or comb-shaped dielectric structure is used, the combination of optics and electronics interconnects are also feasible. Especially, the optical signal with speed over 40 Gb/s or beyond, can pass through the trenches (air filled) or opening portion of the interconnects, and the electrical signal over 5 Gb/s to 40 Gb/s can pass through the metal signal line-configuration disclosed in this invention. Additional transmission media may not be necessary to build for optical and electrical signal purpose.

One advantage of this invention is that the trench of the proposed interconnects can also be used for cooling purposes. The trench can be filled with the coolant or gas to dissipate the heat generated due to electrical signal flowing through the electrical signal lines or heat generated due to the other active and passive components' power consumption.

According to this invention, the interconnects with open trench can be used to transmit the optical signal through the air or vacuum, or low loss-tangent material can be used to fill the trench. In that case, ultra high speed interconnects suitable for electrical and optical signal transmission can be achieved. As the same trench can be used for both electrical and optical interconnects, high density can be achieved for high-speed transmission.

Although the invention has been described with respect to specific embodiments for complete and clear disclosure, the appended claims are not to be thus limited but are to be construed as embodying all modification and alternative constructions that may be occurred to one skilled in the art which fairly fall within the basic teaching here is set forth.

The present invention is expected to be found to be of use practically where the signal speed is necessarily 5 Gb/s or beyond (as high as 200 Gb/s) while using conventional material, and the bandwidth of the interconnects can be made ideal for a no-loss transmission line for the signal to transmit at the speed of light. As ideally the bandwidth of the interconnect system can be made closer to fiber, future monolithic (and also hybrid near future) integration of electronics and optical chips can also be interconnected without sacrificing (much or none at all) of the chip speed.

Although the invention has been described with respect to specific embodiments for a complete and clear understanding of the disclosure, the appended claims are not to be thus limited but are to be construed as embodying all modification and alternative constructions that may occur to one skilled in the art which fairly fall within the basic teaching here set forth.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims along with this patent.

What is claimed is:

1. A high speed electronics interconnection system for interconnecting two or more on-chip electronic elements, said interconnection system comprising:
   at least one electrical signal plane comprising at least one electrical conductor for carrying an electrical signal horizontally along the xy-plane from one electronic element to another;
   at least one first dielectric system, wherein one side of the at least one electrical signal plane is laid on the at least one dielectric system or embedded in the at least one dielectric system, the at least one first dielectric system comprising:
      at least one first dielectric layer, and
      at least one first open trench embedded in the at least one first dielectric layer, wherein each said at least one first open trench is matched with one of said at least one electrical conductor,
      wherein each said at least one first open trench runs parallel with and directly above and/or below the at least one electrical conductor to which said at least one first open trench is matched, such that the xy-coordinates of said at least one first open trench substantially match or overlap with the xy-coordinates of said at least one electrical conductor, and wherein each said at least one first open trench is located in close proximity to the at least one electrical conductor to which said at least one first open trench is matched, such that dielectric loss across said at least one electrical conductor is reduced;

at least one signal via connected to the at least one electrical conductor, and at least two ground vias located in close proximity to said signal via, such that a desired impedance is maintained along the height of said at least one signal via, connected to a ground plane, and oriented to be parallel with the at least one signal via along the entire height of said at least two ground vias.

2. The interconnection system according to claim 1, wherein at least two ground vias surround the at least one signal via at least in part to provide shielding.

3. The interconnection system according to claim 1, wherein the electrical conductor comprises single ended signal line or differential signal lines.

4. The interconnection system according to claim 1, wherein said interconnection system is stacked upon itself at least once.

5. The interconnection system according to claim 1, further comprising another substantially similar first dielectric system stacked on top of the said first dielectric system without any electrical signal plane interposed in between the two dielectric systems.

6. The interconnection system according to claim 5, wherein the ground plane is interposed between the two said first dielectric systems.

7. The interconnection system according to claim 1, further comprising at least one second open trench embedded in the at least one first dielectric layer, and oriented to be parallel with the at least one signal via along the entire height of said at least one second open trench, wherein said at least one second open trench is located in close proximity to said signal via, such that a desired impedance is maintained along the height of said at least one signal via.

8. The interconnection system according to claim 7, wherein the at least one first open trench and/or the at least one second open trench is filled with a liquid coolant.

9. The interconnection system according to claim 7, wherein the at least one first open trench and/or the at least one second open trench is filled with a porous material.

10. The interconnection system according to claim 7, wherein the at least one first open trench and/or at least one second open trench allows optical signals to pass through the at least one first dielectric layer.

11. The interconnection system according to claim 7, wherein said at least one second open trench is located between the at least one signal via and the at least two ground vias.

12. The interconnection system according to claim 7, further comprising a second layer of dielectric material deposited inside the at least one second open trench, wherein the dielectric material can be the same as or different from the at least one first dielectric layer.

13. The interconnection system according to claim 12, further comprising at least two electrical conductors embedded in said at least one electrical signal plane, and further comprising at least one third open trench separating the at least two electrical conductors.

14. The interconnection system according to claim 1 in which the dielectric material in said first dielectric system is selected from a group consisting of ceramic dielectric materials and polymeric dielectric materials.

15. The interconnection system according to claim 1, wherein said interconnection system is fabricated using IC fabrication technology.

16. A high speed electronics interconnection system for interconnecting two or more on-chip electronic elements, said interconnection system comprising:

at least one electrical signal plane comprising at least one electrical conductor for carrying an electrical signal from one electronic element to another;

at least one signal via connected to the at least one electrical conductor;

at least two ground vias, in close proximity to said at least one signal via such that a desired impedance is maintained along the height of said at least one signal via, connected to a ground plane and oriented to be parallel with the at least one signal via along the entire height of said at least one ground via, wherein the at least two ground vias surround the at least one signal via at least in part to provide shielding; and at least one dielectric system, wherein one side of the at least one electrical signal plane is laid on the at least one dielectric system or embedded in at least one dielectric system, the at least one dielectric system comprising:

at least one first dielectric layer; and at least one first open trench embedded in the at least one first dielectric layer in close proximity to said at least one signal via, such that said at least one second open trench reduces the effective dielectric loss of said at least one signal via, and oriented to be parallel with the at least one signal via.

17. A high speed electronics interconnection system for interconnecting two or more on-chip electronic elements, said interconnection system comprising:

a substrate having a top surface and a bottom surface;

at least one integrated circuit type stacked on the top surface of said substrate, wherein each said integrated circuit type is designed to perform at least one particular electronic function;

at least one electrical conductor for carrying electrical signals from one electronic element to another horizontally along the xv-plane;

at least one open trench above and/or below said at least one electrical conductor and oriented to be parallel with the at least one electrical conductor along the entire length of said at least one open trench, wherein each said at least one first open trench is matched with one of said at least one electrical conductor, wherein each said at least one first open trench runs parallel with and directly above and/or below the at least one electrical conductor to which said at least one first open trench is matched, such that the xy-coordinates of said at least one first open trench substantially match or overlap with the xy-coordinates of said at least one electrical conductor, and wherein each said at least one first open trench is located in close proximity to the at least one electrical conductor to which said at least one first open trench is matched, such that dielectric loss across said at least one electrical conductor is reduced;

at least one signal via connected to the at least one electrical conductor; and at least two ground vias, in close proximity to said at least one signal via, such that a desired impedance is maintained along the height of said at least one signal via, connected to a ground plane and oriented to be parallel with the at least one signal via, wherein the at least two ground vias surround the at least one signal via at least in part to provide shielding, and wherein said at least one electrical conductor, said at least one open trench, said at least one signal via, said at least two ground vias, and said ground plane are all placed such that the bottom surface of said substrate remains bare for use in mounting or connecting to external devices.

18. The interconnection system of claim 17, further comprising bumps or balls disposed on the bottom surface of said substrate, thereby providing for external connection to additional devices.

19. The interconnection system according to claim 1, further comprising at least one second dielectric system stacked on top of or below the said first dielectric system, wherein at least one said electrical signal plane is interposed in between the two dielectric systems, and wherein said second dielectric system comprises:

at least one third dielectric layer, and at least one second open trench embedded in the at least one third dielectric layer in close proximity to said at least one signal via, such that said at least one second open trench reduces the effective dielectric loss of said at least one signal via, and oriented to be parallel with the at least one signal via along the entire height of said at least one second open trench.

\* \* \* \* \*